(12) United States Patent
Lowrey et al.

(10) Patent No.: US 6,404,665 B1
(45) Date of Patent: Jun. 11, 2002

(54) COMPOSITIONALLY MODIFIED RESISTIVE ELECTRODE

(75) Inventors: Tyler A. Lowrey, San Jose; Daniel Xu, Mountain View; Chien Chiang, Fremont; Patrick J. Neschleba, San Carlos, all of CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/675,803

(22) Filed: Sep. 29, 2000

(51) Int. Cl.⁷ .............................................. G11C 11/00
(52) U.S. Cl. .................. 365/100; 365/148; 365/163; 257/3; 257/4; 257/5
(58) Field of Search ................... 365/100, 148, 365/163; 257/2–5; 438/622, 625, 900

(56) References Cited

U.S. PATENT DOCUMENTS

| | | | |
|---|---|---|---|
| 5,296,716 A | 3/1994 | Ovshinsky et al. | 257/3 |
| 5,789,758 A * | 8/1998 | Reinberg | 257/3 |
| 5,879,955 A | 3/1999 | Gonzalez et al. | 437/195 |
| 5,920,788 A | 7/1999 | Reinberg | 438/466 |
| 5,933,365 A * | 8/1999 | Klersy et al. | 365/148 |
| 5,970,336 A | 10/1999 | Wolstenhome et al. | 438/238 |
| 5,998,244 A | 12/1999 | Wolstenholme et al. | 438/128 |
| 6,002,140 A | 12/1999 | Gonzalez et al. | 257/3 |
| 6,031,287 A * | 2/2000 | Harshfield | 257/734 |
| 6,087,674 A * | 7/2000 | Ovshinsky et al. | 257/2 |
| 6,153,890 A | 11/2000 | Wolstenholme et al. | 257/3 |
| 6,229,157 B1 | 5/2001 | Sandhu | 257/57 |

* cited by examiner

*Primary Examiner*—Son Mai
(74) *Attorney, Agent, or Firm*—Blakely, Sokoloff, Taylor & Zafman LLP

(57) ABSTRACT

An apparatus comprising a volume of memory material and a pair of spacedly disposed conductors. An electrode coupled to the volume of memory material and disposed between the volume of memory material and one conductor comprises a first material having a first resistivity value and a second material having a different second resistivity value formed by exposing the first material to a gaseous ambient.

22 Claims, 16 Drawing Sheets

US 6,404,665 B1

COMPOSITIONALLY MODIFIED RESISTIVE ELECTRODE

BACKGROUND OF THE INVENTION

1. Field of the Invention

The invention relates generally to programmable memory devices.

2. Background

Typical memory applications include dynamic random access memory (DRAM), static random access memory (SRAM), erasable programmable read only memory (EPROM), and electrically erasable programmable read only memory (EEPROM).

Solid state memory devices typically employ microelectronic circuit elements for each memory bit (e.g., one to four transistors per bit) in memory applications. Since one or more electronic circuit elements are required for each memory bit, these devices may consume considerable chip "real estate" to store a bit of information, which limits the density of a memory chip. The primary "non-volatile" memory element of these devices, such as an EEPROM, typically employ a floating gate field effect transistor device that has limited re-programmability and which holds a charge on the gate of field effect transistor to store each memory bit. These classes of memory devices are also relatively slow to program.

Phase change memory devices use phase change materials, i.e., materials that can be electrically switched between a generally amorphous and a generally crystalline state, for electronic memory application. One type of memory element originally developed by Energy Conversion Devices, Inc. of Troy, Mich. utilizes a phase change material that can be, in one application, electrically switched between a structural state of generally amorphous and generally crystalline local order or between different detectable states of local order across the entire spectrum between completely amorphous and completely crystalline states. Typical materials suitable for such application include those utilizing various chalcogenide elements. These electrical memory devices typically do not use field effect transistor devices, but comprise, in the electrical context, a monolithic body of thin film chalcogenide material. As a result, very little chip real estate is required to store a bit of information, thereby providing for inherently high density memory chips. The state change materials are also truly non-volatile in that, when set in either a crystalline, semi-crystalline, amorphous, or semi-amorphous state representing a resistance value, that value is retained until reset as that value represents a physical state of the material (e.g., crystalline or amorphous). Thus, phase change memory materials represent a significant improvement in non-volatile memory.

One characteristic common to solid state and phase change memory devices is significant power consumption particularly in setting or resetting memory elements. Power consumption is significant, particularly in portable devices that rely on power cells (e.g., batteries). It would be desirable to decrease the power consumption of a memory device.

DETAILED DESCRIPTION OF THE INVENTION

The invention generally relates to an apparatus used, in one aspect, as a memory structure. In one embodiment, the apparatus includes a volume of memory material and a conductor or signal line. The apparatus also includes an electrode coupled to a volume of memory material and disposed between the volume of memory material and the conductor or signal line. The electrode includes a first portion having a first resistivity value and a different second portion having a second resistivity value. In one example, the second electrode portion has a greater resistivity value than the first electrode portion. By varying the resistance in the electrode, the energy applied to program (e.g., set or reset) a portion of the volume of memory material may be concentrated adjacent the volume of memory material and is not distributed through the electrode. In this manner, an improved memory device (e.g., memory element, memory array, etc.) with improved programming capabilities is presented.

The invention also relates to a method, including a method of forming a memory element. In one aspect, the method includes introducing, between contacts formed on a substrate, an electrode material; modifying a portion of the electrode material by exposing the electrode material to a gaseous ambient; and introducing a volume of memory material over the electrode material. In terms of modifying the chemical structure of a portion of the electrode material, in one embodiment, the modified electrode material comprises a first portion and a different second portion. The thermal coefficient of resistivity of the first portion and the second portion of the electrode material may be modified such that, in the presence of energy to, for example, program a memory device, the energy (e.g., thermal energy) may be concentrated at the volume of memory material even at programming temperatures in excess of 600° C. In this manner, a method of forming an improved memory device is presented, including a memory device with improved setting and resetting characteristics.

In the following paragraphs and in association with the accompanying figures, an example of a memory device formed according to an embodiment of the invention is presented. The embodiment describes a memory material including a phase change material wherein the phase of the material determines the state of the memory element.

Figure 1:
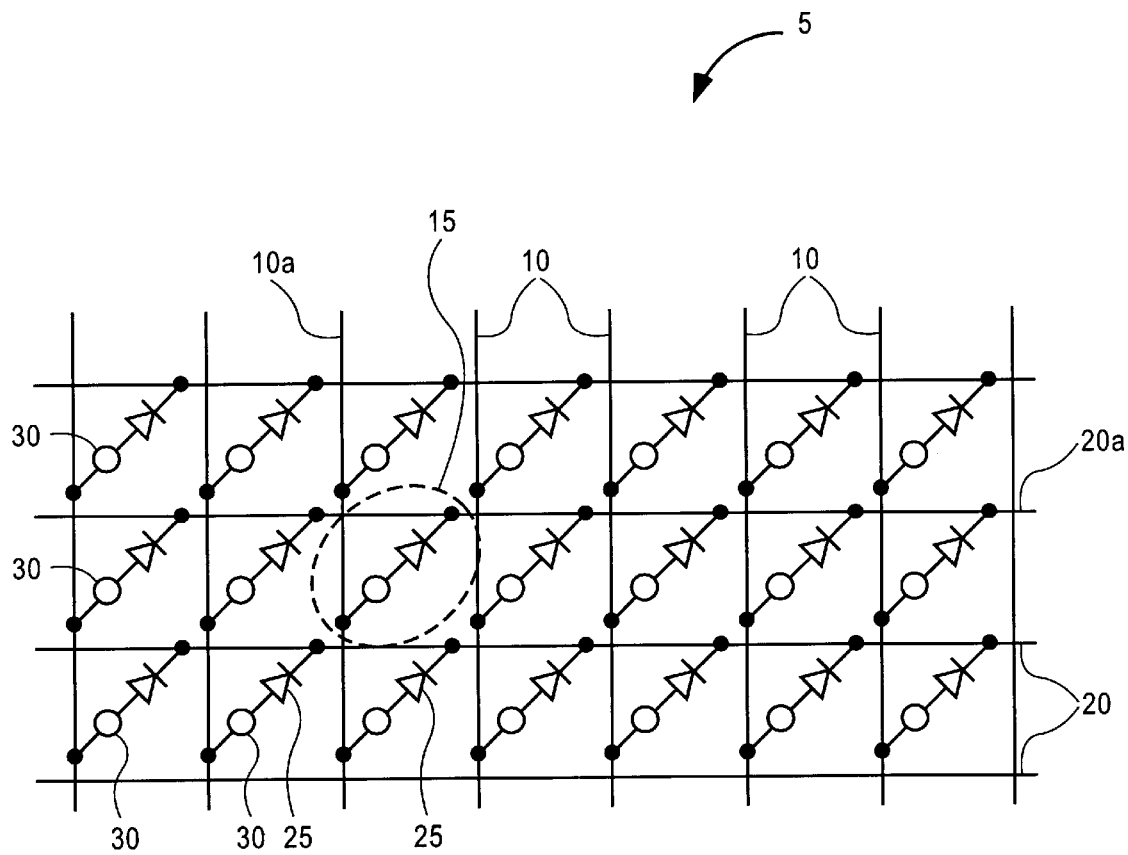
FIG. 1 is a schematic diagram of an array of memory elements according to an embodiment of the invention.

FIG. 1 shows a schematic diagram of an embodiment of a memory array comprised of a plurality of memory elements presented and formed in the context of the invention. In this example, the circuit of memory array 5 includes an xy grid with memory element 30 electrically interconnected in series with isolation device 25 on a portion of a chip. Address lines 10 (e.g., columns) and 20 (e.g., rows) are connected, in one embodiment, to external addressing circuitry in a manner known to those skilled in the art. One purpose of the xy grid array of memory elements in combination with isolation devices is to enable each discrete memory element to be read and written without interfering with the information stored in adjacent or remote memory elements of the array.

A memory array such as memory array 5 may be formed in a portion, including the entire portion, of a substrate. A typical substrate includes a semiconductor substrate such as a silicon substrate. Other substrates including, but not limited to, substrates that contain ceramic material, organic material, or glass material as part of the infrastructure are also suitable. In the case of a silicon semiconductor substrate, memory array 5 may be fabricated over an area of the substrate at the wafer level and then the wafer reduced through singulation into discrete die or chips, some or all of the die or chips having a memory array formed thereon. Additional addressing circuitry (e.g., decoders, etc.) may be formed in a similar fashion as known to those of skill in the art.

Figure 2:
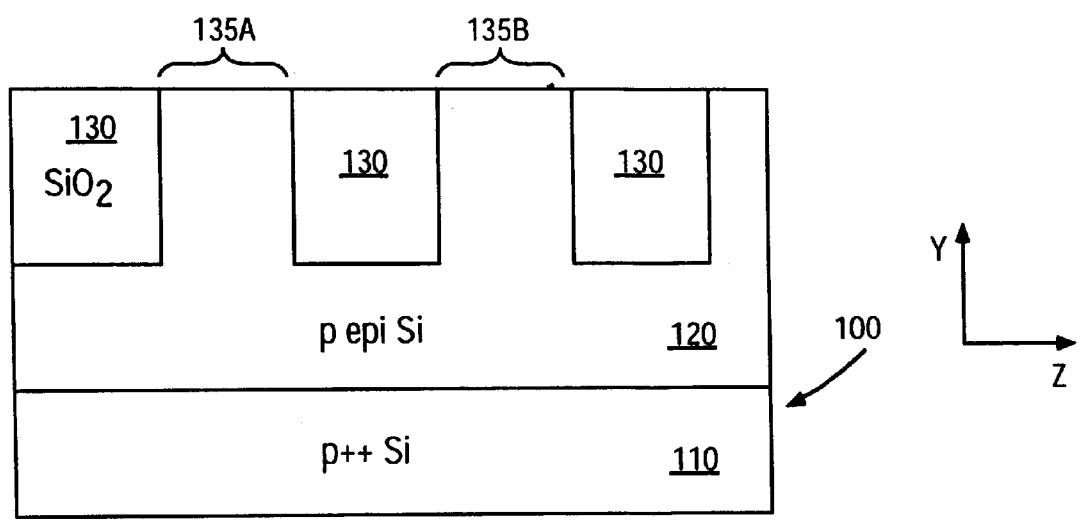
FIG. 2 schematically illustrates a cross-sectional planar side view of a portion of a semiconductor substrate having dielectric trenches formed therein defining a z-direction thickness of a memory cell in accordance with one embodiment of the invention of forming a memory element on a substrate.

FIGS. 2–13 illustrate the fabrication of representative memory element 15 of FIG. 1. FIG. 2 shows a portion of substrate 100 that is, for example, a semiconductor substrate. In this example, a P-type dopant such as boron is introduced in portion 110. In one example, a suitable concentration of P-type dopant is on the order of above $5 \times 10^{19}$–$1 \times 10^{20}$ atoms per cubic centimeters (atoms/cm$^3$) rendering portion 110 of substrate 100 representatively P$^{++}$. Overlying portion 110 of substrate 100, in this example, is portion 120 of P-type epitaxial silicon. In one example, the dopant concentration is on the order of about $10^{16}$–$10^{17}$ atoms/cm$^3$. The introduction and formation of P-type epitaxial silicon portion 120 and P$^{++}$ silicon portion 110 may follow techniques known to those of skill in the art.

FIG. 2 also shows shallow trench isolation (STI) structures 130 formed in epitaxial portion 120 of substrate 100. As will become apparent in the subsequent discussion, STI structures 130 serve, in one aspect, to define the z-direction thickness of a memory element cell, with at this point only the z-direction thickness of a memory element cell defined. In another aspect, STI structures 130 serve to isolate individual memory elements from one another as well as associated circuit elements (e.g., transistor devices) formed in and on the substrate. STI structures 130 are formed according to techniques known to those skilled in the art.

Figure 3:
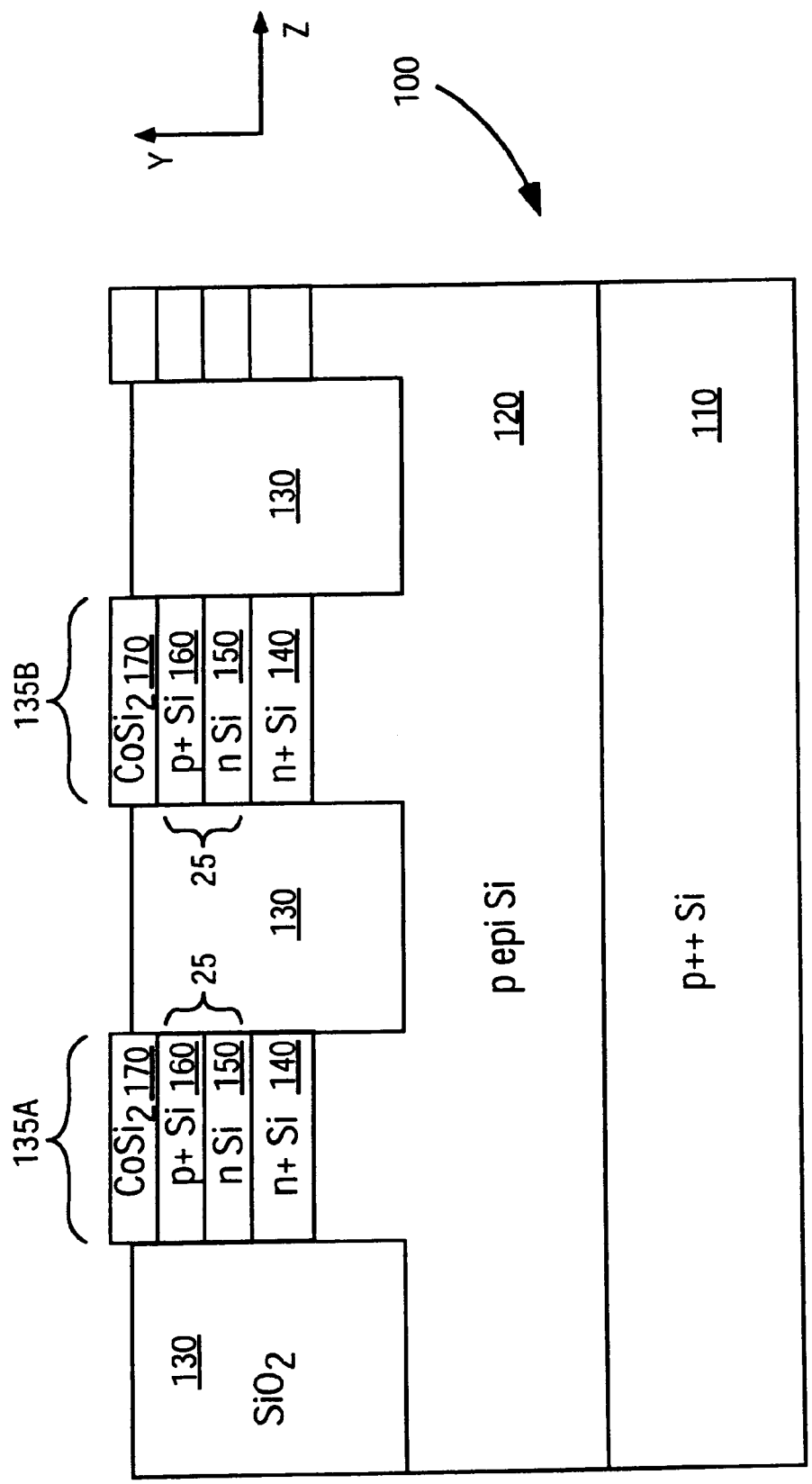
FIG. 3 shows the structure of FIG. 2, through the same cross-sectional view, after the introduction of dopants to form an isolation device for a memory element in accordance with one embodiment of the invention.

FIG. 3 shows the structure of FIG. 2 after a further fabrication operation in memory cell regions 135A and 135B. In one embodiment, memory cell regions 135A and 135B are introduced as strips with the x-direction dimension greater than the z-direction dimension. Overlying epitaxial portion 120 of substrate 100 is first conductor or signal line material 140. In one example, first conductor or signal line material 140 is N-type doped polysilicon formed by the introduction of, for example, phosphorous or arsenic to a concentration on the order of about $10^{18}$–$10^{19}$ atoms/cm$^3$ (e.g., N$^+$ silicon). In this example, first conductor or signal line material 140 serves as an address line, a row line (e.g., row line 20 of FIG. 1). Overlying first conductor or signal line material 140 is an isolation device (e.g., isolation device 25 of FIG. 1). In one example, the isolation device is a PN diode formed of N-type silicon portion 150 (dopant concentration on the order of about $10^{17}$–$10^{18}$ atoms/cm$^3$) and P-type silicon portion 160 (dopant concentration on the order of about $10^{19}$–$10^{20}$ atoms/cm$^3$). Although a PN diode is shown, it is to be appreciated that other isolation structures are similarly suitable. Such devices include, but are not limited to, MOS devices.

Referring to FIG. 3, overlying the isolation device in memory cell regions 135A and 135B is reducer material 170 of, in this example, a refractory metal silicide such as cobalt silicide (CoSi$_2$). Reducer material 170, in one aspect, serves as a low resistance material in the fabrication of peripheral circuitry (e.g., addressing circuitry) of the circuit structure on the chip. Thus, reducer material 170 is not required in terms of forming a memory element as described. Nevertheless, because of its low resistance property, its inclusion as part of the memory cell structure between isolation device 25 and memory element 30 is utilized in this embodiment.

Figure 4:
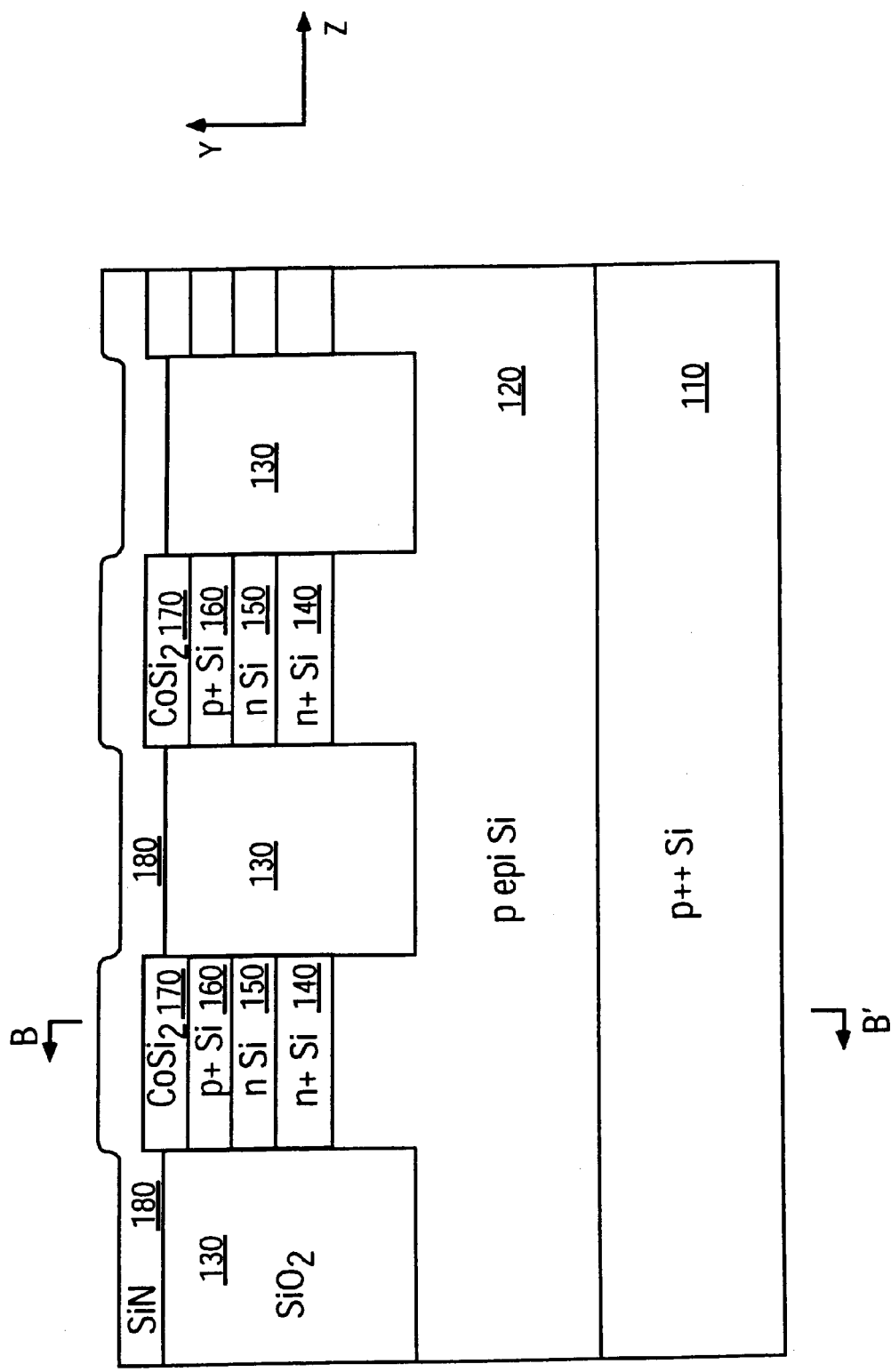
FIG. 4 shows the structure of FIG. 3 after the introduction of a masking material over the structure in accordance with one embodiment of the invention.
Figure 5:
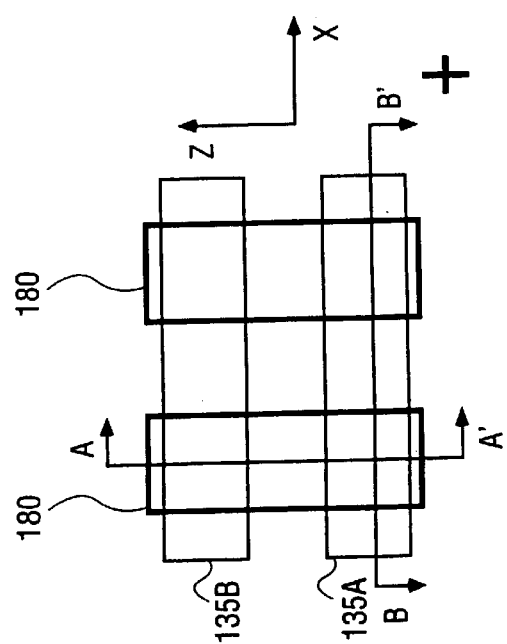
FIG. 5 shows a schematic top view of the structure of FIG. 4.
Figure 6:
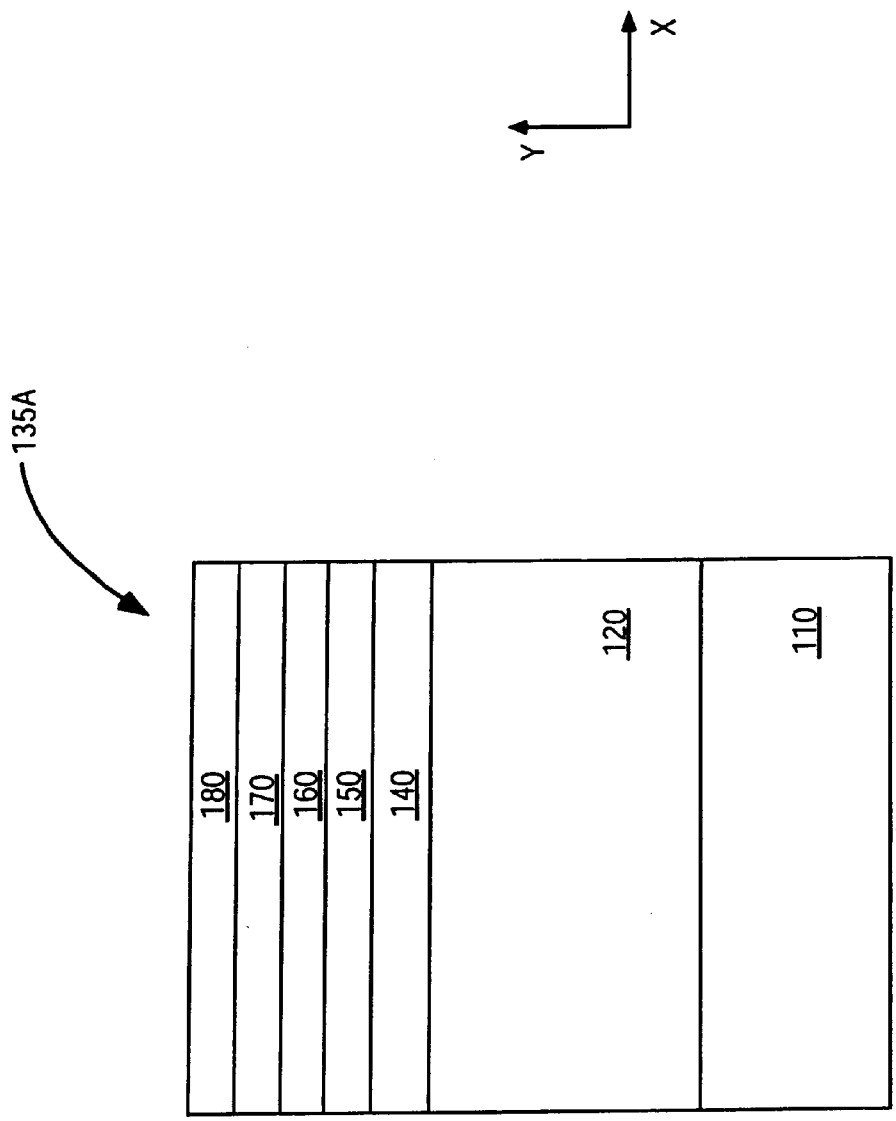
FIG. 6 shows the cross-section of the structure of FIG. 4 through line B–B'.

FIG. 4 shows the structure of FIG. 3 after the introduction of masking material 180. As will become clear later, masking material 180 serves, in one sense, as an etch stop for a subsequent etch operation. FIG. 5 schematically shows memory cell regions 135A and 135B in an xz plane. Overlying the memory cell is masking material 180. FIG. 6 shows a cross-sectional side view of memory cell region 135A through line B—B' of FIG. 5 (i.e., an xy perspective). In one embodiment, a suitable material for masking material 180 is a dielectric material such as silicon nitride (Si$_3$N$_4$).

Figure 7:
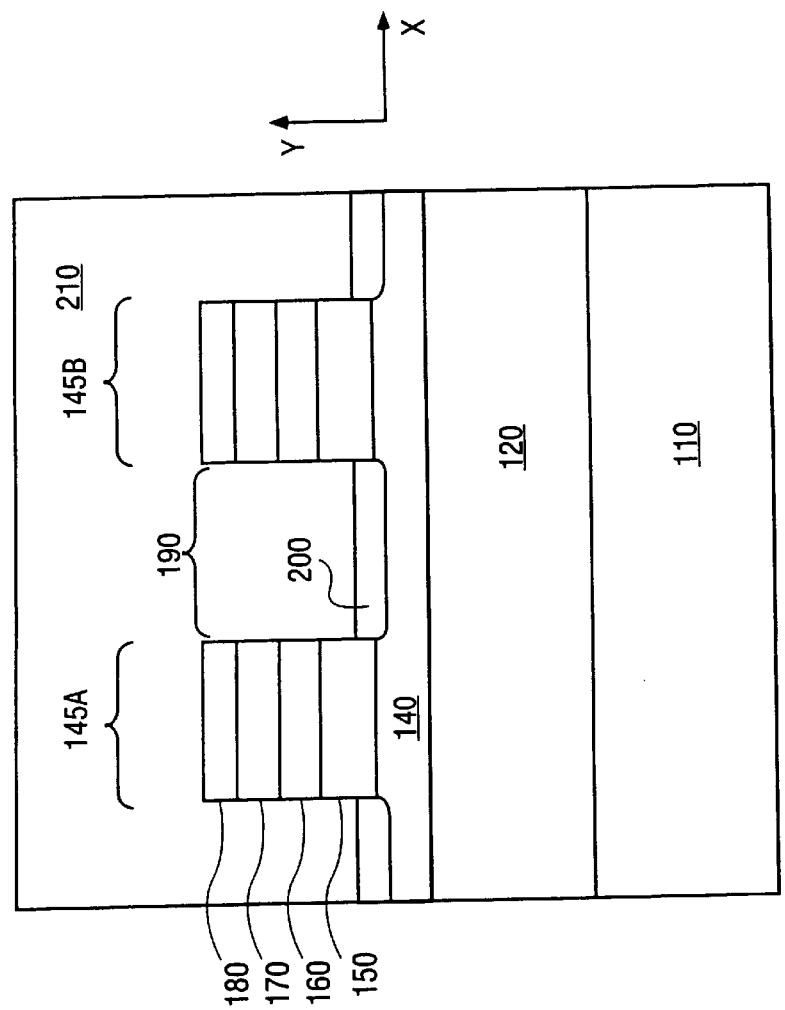
FIG. 7 shows the structure of FIG. 5, through the same cross-sectional view, after the patterning of the x-direction thickness of a memory cell, the introduction of a dopant between the cells, and the introduction of a dielectric material over the structure.

FIG. 7 shows the structure of FIG. 6 (from an xy perspective) after patterning of the x-direction thickness of the memory cell material. FIG. 7 shows two memory cells 145A and 145B patterned from memory cell region 135A (see FIG. 5). The patterning may be accomplished using conventional techniques for etching, in this example, refractory metal silicide and silicon material to the exclusion of masking material 180 (e.g., $Si_3N_4$). The definition of the x-direction thickness involves, in one embodiment, an etch to conductive material 150 of the memory line stack to define memory cells 145A and 145B of memory cell region 135A. In the case of an etch, the etch proceeds through the memory line stack to, in this example, a portion of conductor or signal line material 150. A timed etch may be utilized to stop an etch at this point. Following the patterning, N-type dopant is introduced at the base of each trench 190 to form pockets 200 having a dopant concentration on the order of about $10^{18}$–$10^{20}$ atoms/cm$^3$ (e.g., N$^+$ region) between memory cells 145A and 145B. Pockets 200 serve, in one sense, to maintain continuity of a row line. Dielectric material 210 of, for example, silicon dioxide material is then introduced over the structure to a thickness on the order of 100 Å to 50,000 Å.

Figure 8:
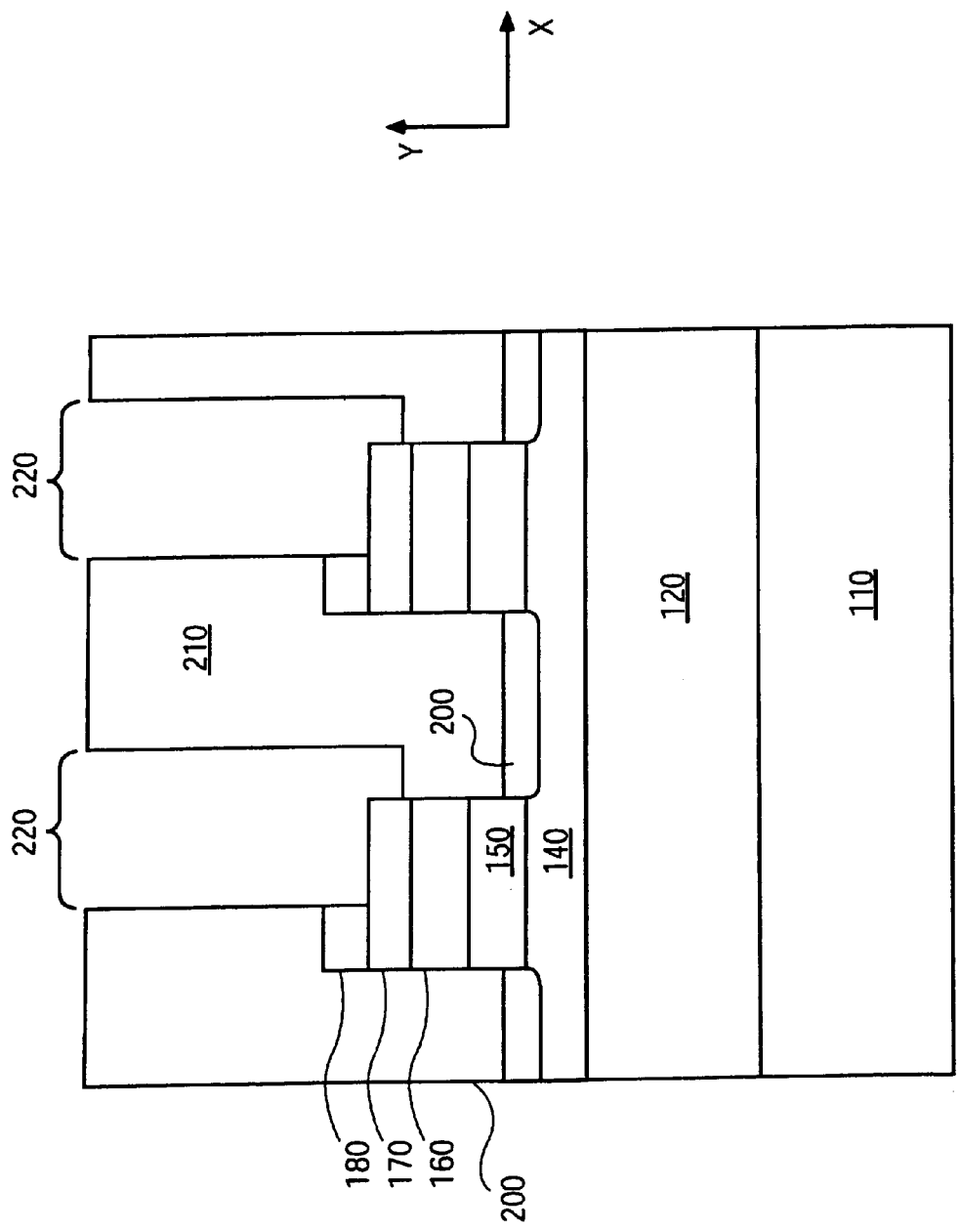
FIG. 8 shows the structure of FIG. 7, through the same cross-sectional view, after the formation of trenches through the dielectric material in accordance with one embodiment of the invention.

FIG. 8 shows the structure of FIG. 7 after the formation of trenches 220 through dielectric materials 210 and 180 to reducer material 170. The formation of trenches 220 may be accomplished using etch patterning with an etchant(s) selective for etching dielectric material 210 and masking material 180 and not reducer material 170 (e.g., reducer 170 serving as an etch stop).

Figure 9:
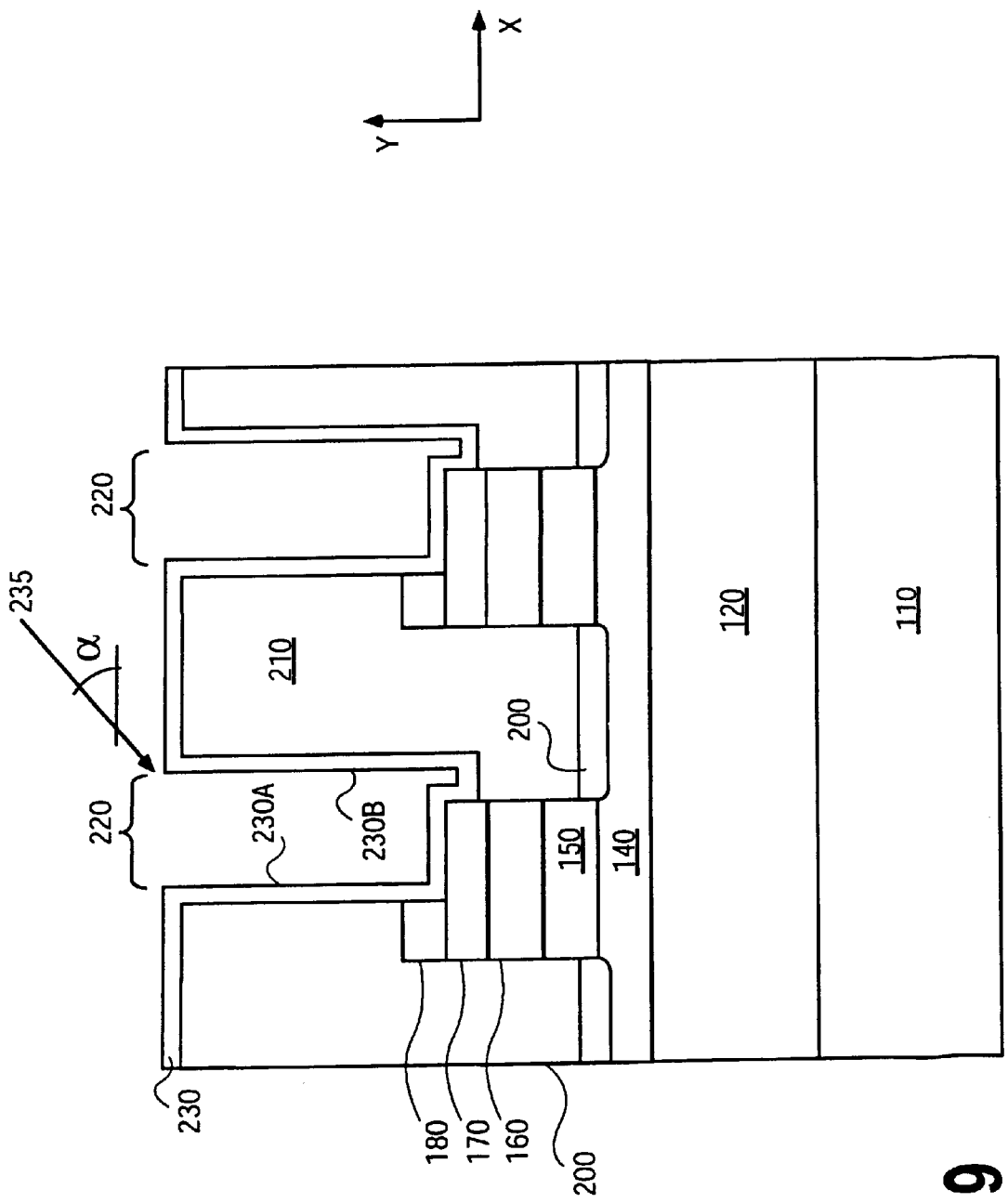
FIG. 9 shows the structure of FIG. 8, through the same cross-sectional view, after the introduction of an electrode material over the structure in accordance with one embodiment of the invention.

FIG. 9 shows the structure of FIG. 8 after the conformal introduction of electrode material 230. In one example, electrode material 230 is polycrystalline semiconductor material such as polycrystalline silicon. Other suitable electrode material include carbon and semi-metals such as transition metals, including but not limited to titanium, tungsten, titanium nitride (TiN) and titanium aluminum nitride (TiAlN). The introduction is conformal in the sense that electrode material 230 is introduced along the side walls and base of trench 220 such that electrode material 230 is in contact with reducer material 170. The conformal introduction of electrode material 230 that is polycrystalline silicon, for example, may follow conventional introduction techniques known to those skilled in the art including chemical vapor deposition (CVD) techniques.

In the example where electrode material 230 is semiconductor material such as polycrystalline silicon, following the introduction of electrode material 230, a dopant is introduced into the polycrystalline silicon to, in one aspect, lower the resistance of the material. In the example shown, a suitable dopant is a P-typed dopant such as boron introduced to a concentration on the order of about $10^{19}$–$10^{20}$ atoms/cm$^3$. In one embodiment, the dopant is introduced at an angle such that electrode material 230A along a side wall of trench 220 is primarily exposed to the dopant while electrode material 230B is exposed to little or no dopant. In this manner, the resistance of electrode material 230A may be reduced below the resistance of electrode material 230B. In the case of polycrystalline silicon, in one example, electrode material 230B is substantially intrinsic silicon. FIG. 9 shows dopant introduction 235, such as an implantation, at angle, α, of approximately 60° from horizontal to introduce a dopant (e.g., P-typed dopant) into electrode material 230A to the significant exclusion of electrode material 230B. Such an angle implantation may be carried out according to techniques known to those skilled in the art.

In another embodiment, electrode material 230A is counter-doped. A first dopant introduced along a portion of electrode material 230A (again at an angle) adjacent reducer material 170 is of a first type (e.g., P$^+$-type). A second dopant introduced (also at an angle) over another portion of electrode material 230A is of a second type (e.g., N$^+$-type). In the example of P$^+$-type and N$^+$-type counterdoping, the different portions of electrode material 230A have different levels of charge carriers (e.g., N$^+$-type portion>P$^+$-type portion). The difference in charge carriers generally modifies the resistance of the electrode.

Figure 10:
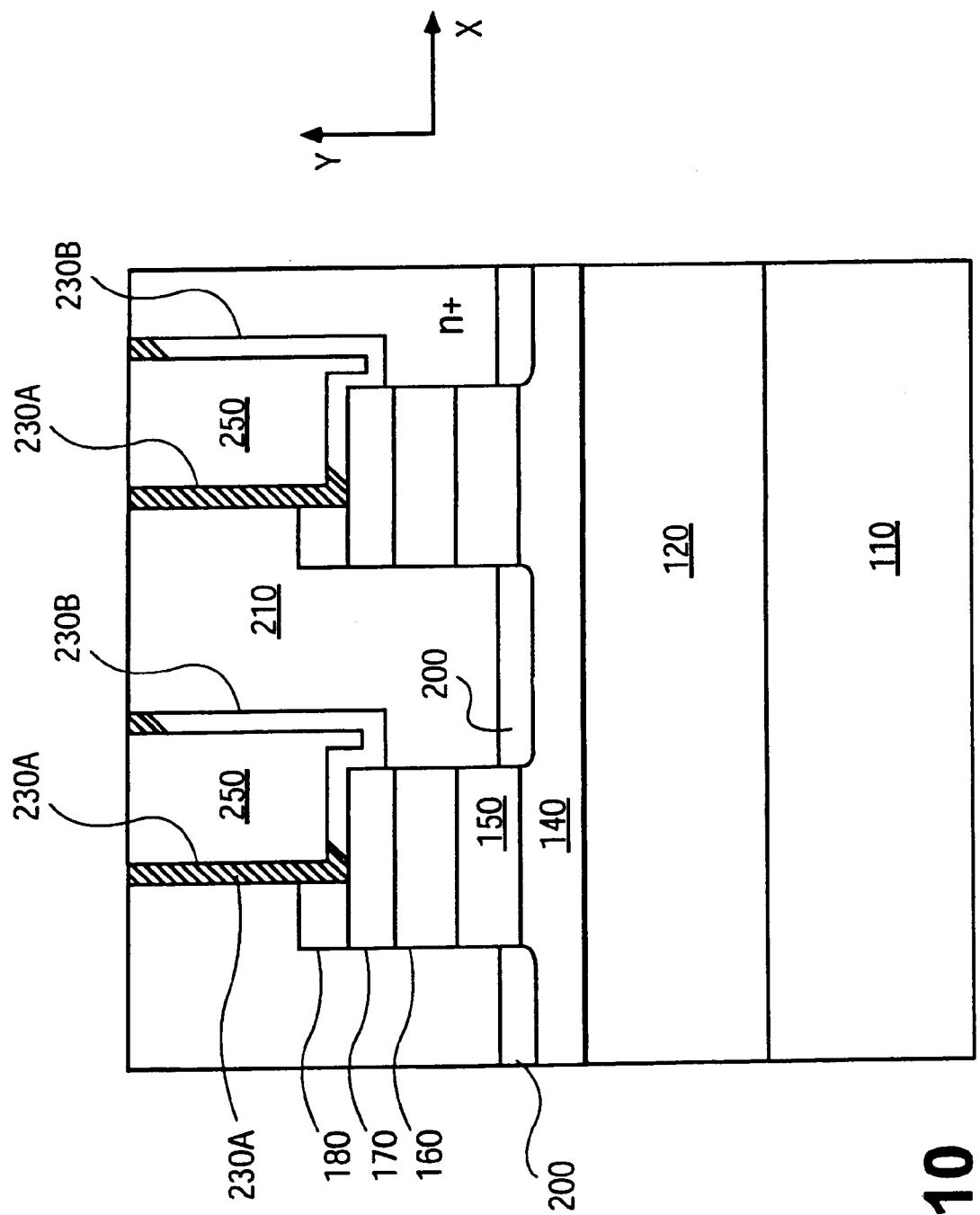
FIG. 10 shows the structure of FIG. 9, through the same cross-sectional view, after the introduction of a dopant into the electrode material in accordance with one embodiment of the invention.

FIG. 10 shows the structure of FIG. 9 after the introduction of a dopant into electrode material 230A. As illustrated, the electrode material 230A is doped (with one dopant or counter-doped) about its length from reducer material 170. FIG. 10 also shows the structure after the introduction of dielectric material 250 into trenches 220 and a planarization step that removes the horizontal component of electrode material 230. Suitable planarization techniques include those known to those of skill in the art, such as chemical or chemical-mechanical polish (CMP) techniques.

Following, in this example, the introduction of a dopant into polycrystalline silicon electrode material 230A, the structure is submitted to a thermal treatment in the presence of a modifying species to introduce such species into electrode material 230A. Suitable modifying species include, but are not limited to, oxygen (O$_2$), nitrogen (N$_2$) and ammonia (NH$_3$) that, it is believed, react with polycrystalline silicon to form silicon dioxide (SiO$_2$) and silicon nitride (Si$_3$N$_4$), and silicon oxynitride (Si$_3$N$_4$). Alternatively, where electrode material 230A comprises TiN, a suitable modifying species includes oxygen that, it is believed, reacts with TiN to form titanium oxynitride (TiN$_x$O$_y$).

Whether the modifying species react with or combine with electrode material 230A, the modifying species is introduced to raise the local resistance of electrode material 230A adjacent the surface of electrode material 230A. One suitable thermal treatment is a rapid thermal anneal (RTA) in, for example, a radiantly-heated environment. Suitable temperature ranges are 420° C. to 1150° C. for a duration long enough to introduce the modifying species into at least the first few monolayers adjacent the surface of electrode material 230A. Durations of a few seconds to a few minutes are suitable. One example of a suitable RTA to introduce a modifying species of NH$_3$ into polycrystalline silicon electrode material 230A is a temperature of 756° C. for 60 seconds at a flow rate of four standard liters per minute to form Si$_3$N$_4$ in the first few monolayers of electrode material 230A.

Figure 11:
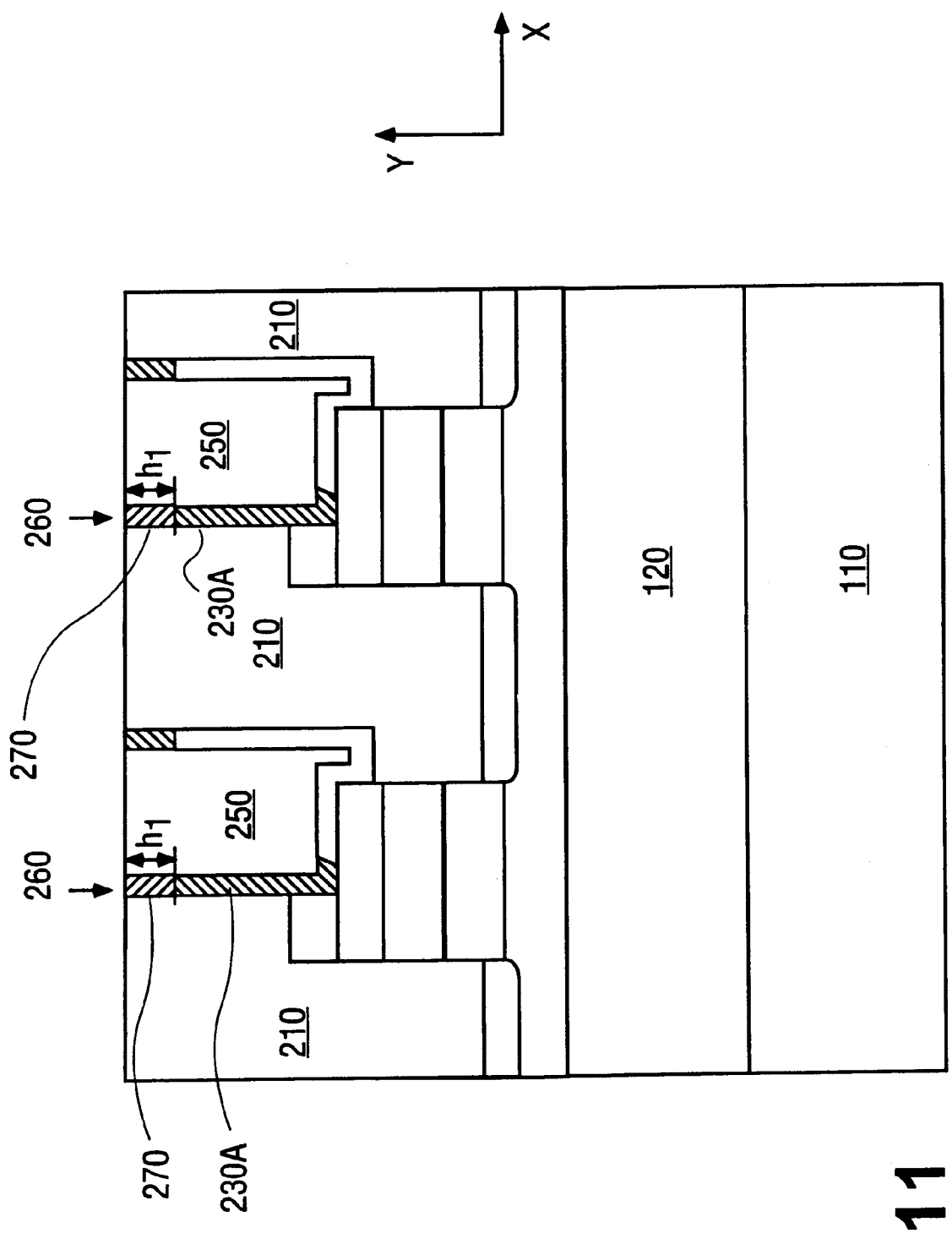
FIG. 11 shows the structure of FIG. 10, through the same cross-sectional view, after the introduction of a modifying species into a portion of the electrode material in accordance with one embodiment of the invention.

FIG. 11 shows the structure of FIG. 10 after the introduction of modifying species 260 into a portion of electrode material 230A. In one embodiment, modifying species 260 is introduced to raise the local resistance of electrode material 230A at a portion of electrode material 270 defined by length, h$_1$. Electrode material 270 of polycrystalline silicon and SiO$_2$, Si$_3$N$_4$ or Si$_x$O$_y$N$_z$ generally has a higher resistivity than doped polycrystalline silicon of electrode material 230A. Suitable materials for modifying species also include those materials that are introduced (e.g., added, reacted, or combined) into electrode material 230A and raise the resistivity value within the electrode (e.g., raise the local resistance near a volume of memory material), and the resistivity value is also stable at high temperatures. One measure of stability is a material's thermal coefficient of resistivity (TCR). A TCR represents a change in resistance of a material with a change in temperature. In general, semiconductor materials tend to have large negative TCRs. Polycrystalline silicon and semiconductors tend to significantly change their resistivity value in response to positive temperature. At high temperatures (e.g., 600 to 1200° C. or more), the resistivity of these materials decreases due to the generation of intrinsic charge carriers. Such materials may also experience thermal runaway relating to a material's stability at high temperatures. Materials with large negative TCRs may experience thermal runaway which can lead to inhomogeneous current patterns in an electrode. Thus, in one aspect, modifying species 260 is selected such that, when added, reacted, or combined with electrode material 230A, the TCR has a lower variation to positive temperature change, so that the resistivity at temperatures of 600° C. or more is stable. Lightly doped polycrystalline silicon has a larger negative TCR than more heavily doped polycrystalline silicon. At high temperatures (e.g., greater than 600° C.), the resistance is primarily determined by the silicon, not the dopants. Polycrystalline silicon with SiC or $SiO_2$ introduced, for example, yields an electrode material having a portion with a generally more stable TCR at high temperatures than polycrystalline silicon alone, likely the result of the wider conduction band associated with SiC or $SiO_2$.

Referring to FIG. 11, modifying species 260 is introduced into electrode material 230A to form electrode material 270. FIG. 11 shows the structure having an electrode of two different material portions: electrode material 230A (e.g., doped polycrystalline silicon) and electrode material 270 (e.g., polycrystalline silicon and $SiO_2$, $Si_3N_4$, etc.). Electrode material 270 is introduced into a portion of the electrode adjacent the exposed surface of the electrode. Electrode material 270 is selected to have a low TCR with little or no change with positive temperature change so that at programming temperatures of 600° C. or more, the resistivity of electrode material 270 does not decrease to a value lower than a resistivity at a reduced non-programming temperature. In one example, electrode material 270 has a resistivity, $R_1$, that is higher than a resistivity, $R_2$, of electrode material 230A at temperatures greater than 600° C. or at least has a thermal coefficient of resistivity that has a lower variation to positive temperature change. Modifying species 260 of oxygen, or nitrogen when introduced into polycrystalline silicon or titanium nitride (TiN) to form electrode material 270 has shown a reduced TCR compared to polycrystalline silicon, with electrode material 270 having a greater resistivity, $R_1$, at 600° C. to 650° C. than electrode material 230A of polycrystalline silicon.

The amount/depth of the electrode material 270 generally depends on the amount of voltage that will be used to set or reset a volume of memory material. Using voltages in the range of about 3.3 volts (V) according to current technology, a suitable depth for electrode material 270 of, for example, $SiO_2$ or $Si_3N_4$ into a polycrystalline silicon electrode is approximately the first few monolayers up to 600 angstroms (Å). At lower voltages, a shorter depth would be suitable. In terms of amount of electrode material 270, amounts of 0.1 to 20 atomic percent of modifying species 260 are suitable, 0.5 to 10 percent are preferred, and 0.5 to five percent are more preferred.

As described above, electrode material 270 will be substantially adjacent to a volume of memory material. Electrode material 270 may be selected also for its surface chemical composition in promoting adhesion of a subsequently introduced volume of memory material. $Si_3N_4$, for example, shows good adhesion properties for a volume of chalcogenide memory material. In some cases, electrode material 270 may not provide sufficiently suitable ohmic contact between the electrode and the volume memory material for a desired application. In such cases, modifying material may be introduced into the electrode at a depth below the exposed surface of the electrode. In the example described, an electrode of polycrystalline silicon may have polycrystalline silicon at the exposed surface (referring to FIG. 11) and modifying material 270 at a depth below the exposed surface but not throughout or adjacent for the exposed surface (e.g., 200–1000 Å below the exposed surface). In one example, a second introduction (e.g., deposition) may also be employed to follow the introduction of electrode material 270 and locate polycrystalline silicon adjacent the exposed surface of the electrode.

Figure 12:
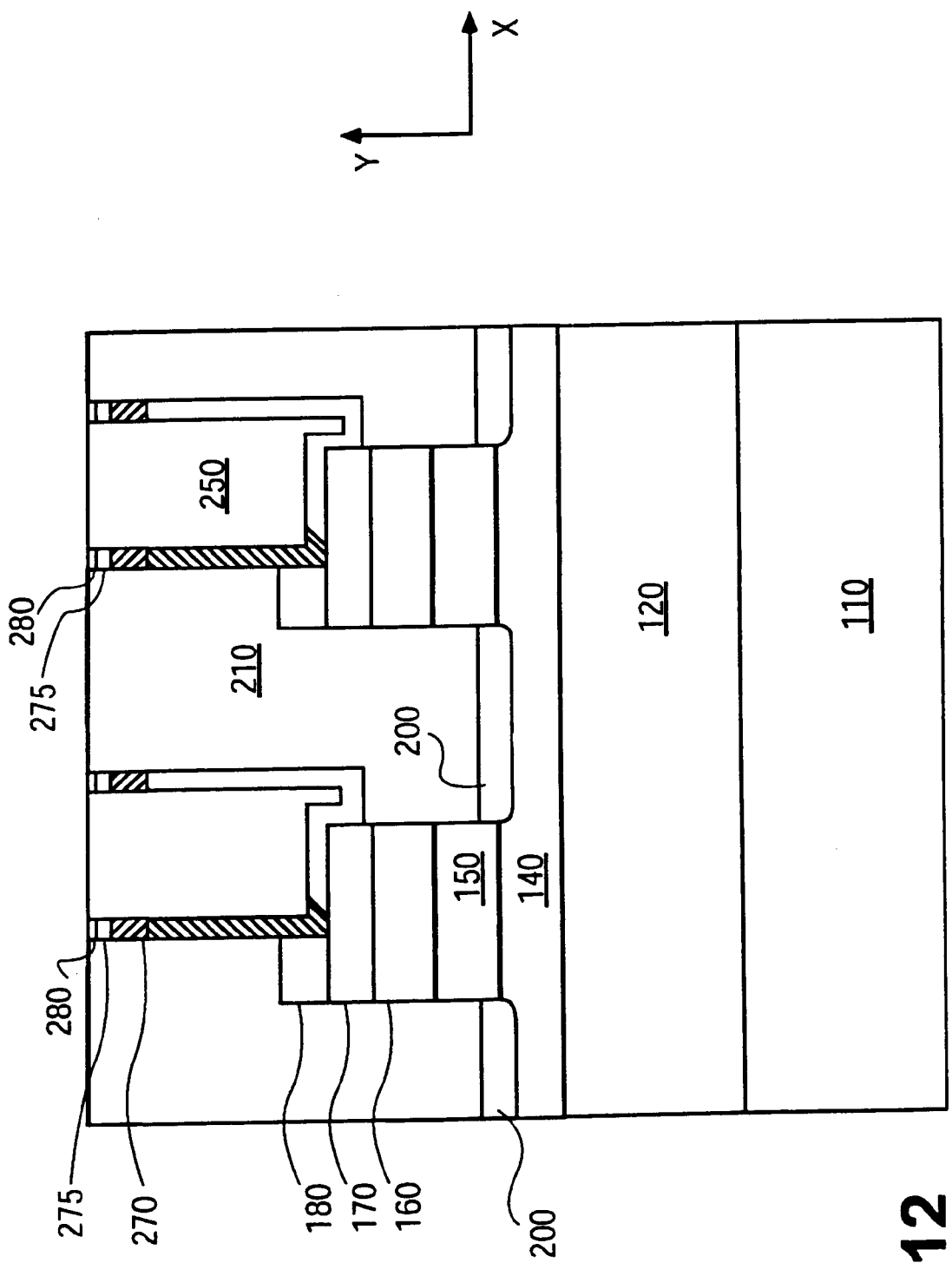
FIG. 12 shows the structure of FIG. 11, through the same cross-sectional view, after the introduction of barrier material over the electrode in accordance with one embodiment of the invention.

FIG. 12 shows the structure of FIG. 11 after the optional introduction of barrier materials 275 and 280. Barrier material 275 is, for example, titanium silicide ($TiSi_2$) introduced to a thickness on the order of about 100–300 Å. Barrier material 280 is, for example, titanium nitride (TiN) similarly introduced to a thickness on the order of about 25–300 Å. The introduction of barrier materials 275 and 280 may be accomplished using techniques known to those skilled in the art.

Figure 13:
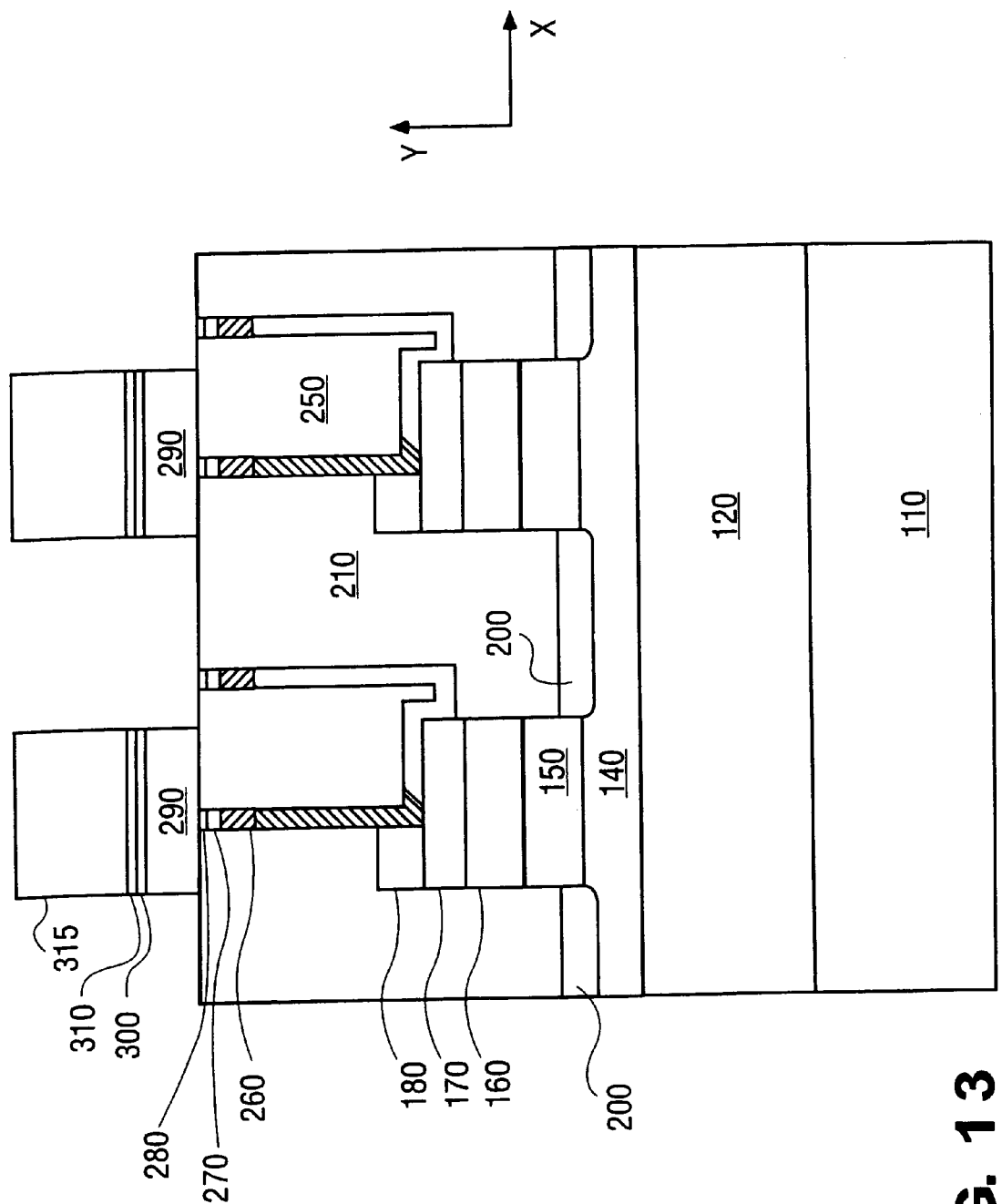
FIG. 13 shows the structure of FIG. 12, through the same cross-sectional view, after the introduction of a volume of memory material and second conductors over the structure, in accordance with one embodiment of the invention.

FIG. 13 shows the structure of FIG. 12 after the introduction of a volume of memory material 290 (represented as memory element 30 in FIG. 1). In one example, memory material 290 is a phase change material. In a more specific example, memory material 290 includes a chalcogenide element(s). Examples of phase change memory material 290 include, but are not limited to, compositions of the class of tellerium-germanium-antimony ($Te_xGe_ySb_2$) material. The volume of memory material 290, in one example according to current technology, is introduced and patterned with a thickness on the order of about 600 Å.

In one embodiment, the electrode material including or not including one or both of the optional barrier materials 275 and 280 is "edgewise adjacent" to memory material 290. That is, only an edge or a portion of an edge of the electrode material is adjacent to memory material 290. Substantially all of the remainder of the electrode is remote to memory material 290. Preferably, substantially all of the electrical communication between the electrode is through an edge of the electrode or a portion of an edge. That is, it is preferable that substantially all electrical communication is through at least a portion of an edge (i.e., an "edge portion") of the electrode.

As used herein the terminology "area of contact" is the portion of the surface of an electrical contact through which the electrical contact electrically communicates with memory material 290. As noted, in one embodiment, substantially all electrical communication between memory material 290 and the electrode occurs through all or a portion of an edge of the electrode. Hence, the area of contact between the electrode and memory material 290 is an edge of the electrode or a portion of an edge of the electrode. That is, the area of contact between the electrode and memory material 290 is an "edge portion" of the electrode. It is again noted that the electrode need not actually physically contact memory material 290. It is sufficient that the electrode is in electrical communication with memory material 290. The area of contact, being only an edge portion (i.e., an edge or a portion of an edge) of the electrode, is thus very small and is proportional to the thickness of the electrode.

Overlying the volume of memory material 290 in the structure of FIG. 13 are barrier materials 300 and 310 of, for example, titanium (Ti) and titanium nitride (TiN), respectively. Barrier material serves, in one aspect, to inhibit diffusion between the volume of memory material 290 and second conductor or signal line material overlying the volume of memory material 290 (e.g., second electrode 10).

Overlying barrier materials 300 and 310 is second conductor or signal line material 315. In this example, second conductor or signal line material 315 serves as an address line, a column line (e.g., column line 10 of FIG. 1). Second conductor or signal line material 315 is patterned to be, in one embodiment, generally orthogonal to first conductor or signal line material 140 (column lines are orthogonal to row lines). Second conductor or signal line material 315 is, for example, an aluminum material, such as an aluminum alloy. Methods for the introduction and patterning of the barrier materials and second conductor or signal line material 315 include such techniques as known to those of skill in the art.

Figure 14:
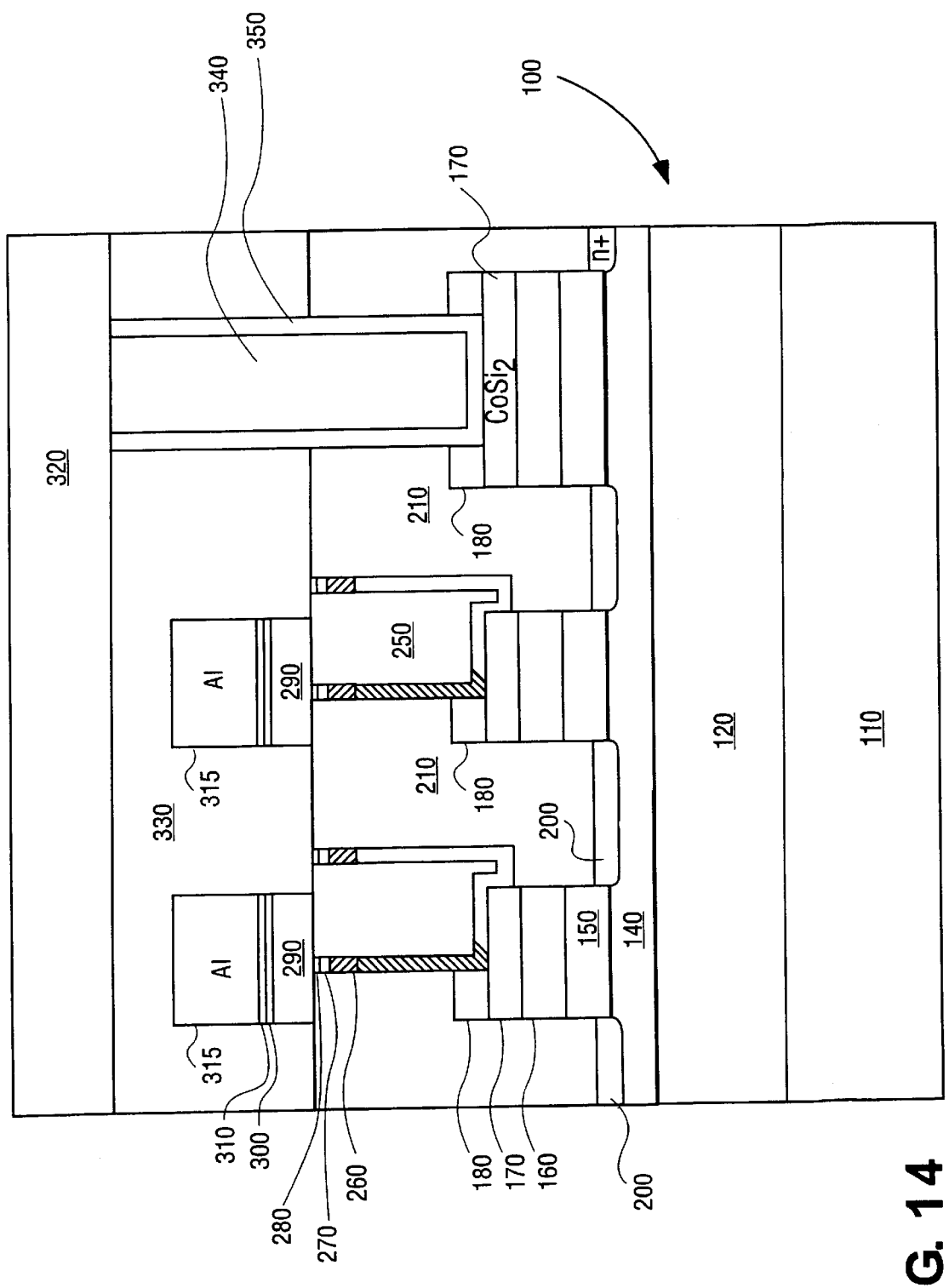
FIG. 14 shows the structure of FIG. 13, through the same cross-sectional view, after the introduction of the dielectric material over the second conductor and a third conductor coupled to the first conductor in accordance with an embodiment of the invention.

FIG. 14 shows the structure of FIG. 13 after the introduction of dielectric material 330 over second conductor or signal line material 315. Dielectric material 330 is, for example, $SiO_2$ or other suitable material that surrounds second conductor or signal line material 315 and memory material 290 to electronically isolate such structure. Following introduction, dielectric material 330 is planarized and a via is formed in a portion of the structure through dielectric material 330, dielectric material 210, and masking material 180 to reducer material 170. The via is filled with conductive material 340 such as tungsten (W) and barrier material 350 such as a combination of titanium (Ti) and titanium nitride (TiN). Techniques for introducing dielectric material 330, forming and filling conductive vias, and planarizing are known to those skilled in the art.

The structure shown in FIG. 14 also shows additional conductor or signal line material 320 introduced and patterned to mirror that of first conductor or signal line material 140 (e.g., row line) formed on substrate 100. Mirror conductor line material 320 mirrors first conductor or signal line material 140 and is coupled to first conductor or signal line material 140 through a conductive via. By mirroring a doped semiconductor such as N-type silicon, mirror conductor line material 320 serves, in one aspect, to reduce the resistance of conductor or signal line material 140 in a memory array, such as memory array 5 illustrated in FIG. 1. A suitable material for mirror conductor line material 320 includes an aluminum material, such as an aluminum alloy.

In the above description of forming a memory element such as memory element 15 in FIG. 1, an electrode is described between a memory material and conductors or signal lines (e.g., row lines and column lines) that has improved electrical characteristics. In the embodiment described, the resistivity of the electrode is modified by fabricating an electrode of a first material (e.g., polycrystalline silicon) having a resistivity, $R_2$, and a second material (e.g., $SiO_2$/poly or $Si_3N_4$/poly) of a second higher resistivity, $R_1$, at temperatures greater than 600° C. The higher resistivity material is located adjacent, either proximally or directly, the volume of memory material. In this manner, a supplied voltage from second conductor or signal line material 320 or first conductor or signal line material 140 to the memory material may be near the volume of memory material and dissipation of energy to cause a phase change may be minimized.

In memory element 15, the electrode delivers electrical current to the memory material. As the electrical current passes through the electrode and through the memory material, at least a portion of the electric potential energy of the electrons is transferred to the surrounding material as heat. That is, the electrical energy is converted to heat energy via Joule heating. The amount of electrical energy converted to heat energy (that is, the amount of Joule heating) increases with the resistivity of the material as well as with the current density passing through the material. By locating a more resistive material adjacent to the memory material and a less resistive material remote to the memory material, there is a relatively high power dissipation from Joule heating at the more resistive material and a relatively low power dissipation at the less resistive material.

While not wishing to be bound by theory, it is believed that dissipating power in the electrical contact from Joule heating adjacent to the memory material may at least partially assist (or may even dominate) the programming of the memory material. It is also believed that dissipating power in the electrical contact remote to the memory material may actually waste power and increase the total energy needed to program the memory material. Hence, providing an electrical contact structure having a relatively high power dissipation adjacent to the memory material and a relatively low power dissipation remote to the memory material may thus decrease the total power and energy needed to program the memory device.

Furthermore, as noted above, the electrode may be edgewise adjacent to the memory material and the area of contact between the memory material and the electrode may be an edge or a portion of an edge of the electrode. This may be a very small area of contact. While not wishing to be bound by theory it is believed that reducing the size of the area of contact reduces the volume of the memory material which is programmed, thereby reducing the total current needed to program the memory device.

The discussion detailed the formation of one memory element of memory array 5. Other memory elements of memory array 5 may be fabricated in the same manner. It is to be appreciated that many, and possibly all, memory elements of memory array 5, along with other integrated circuit circuitry, may be fabricated simultaneously.

Figure 15:
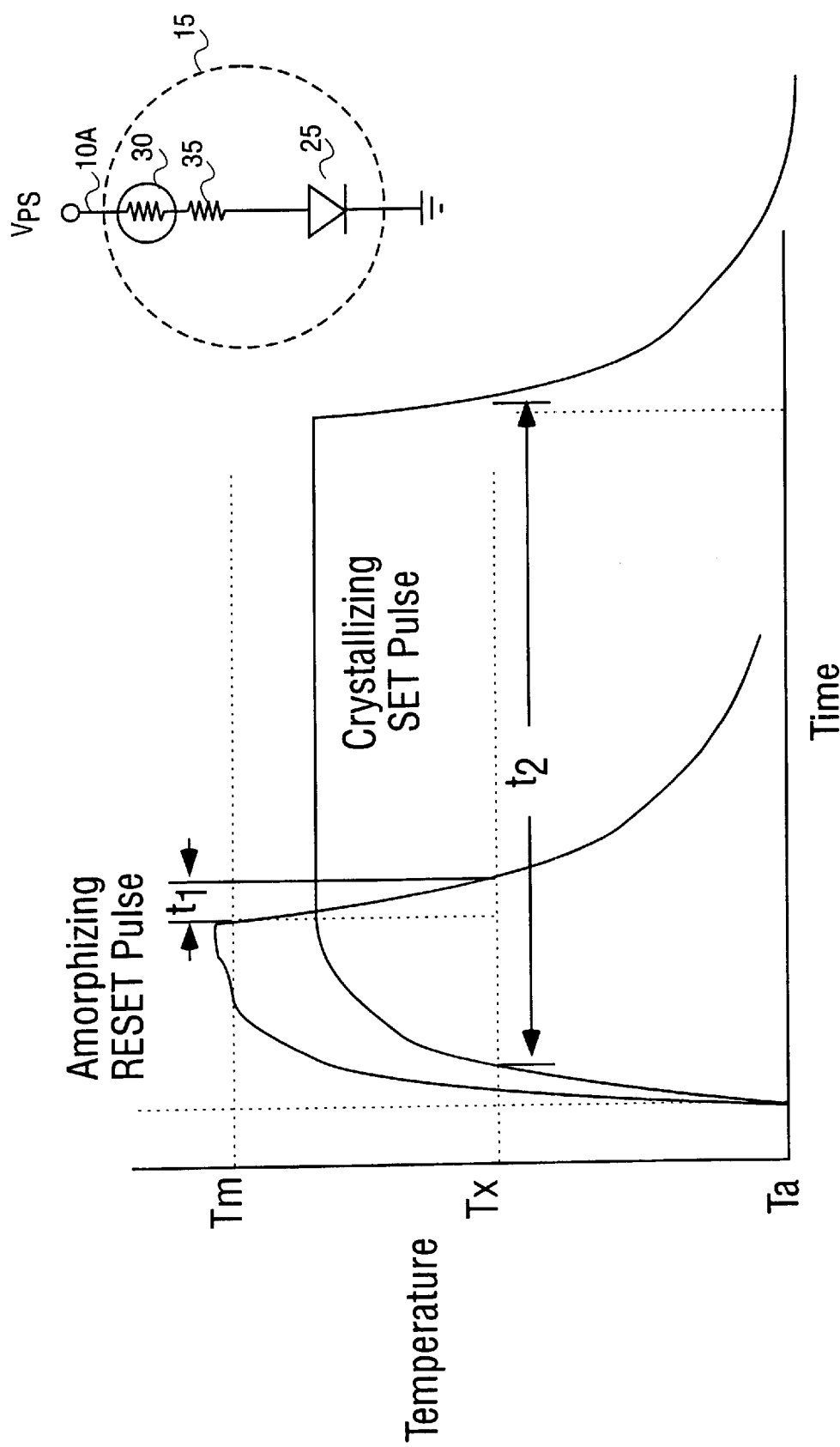
FIG. 15 shows a graphical representation of setting and resetting a volume of a phase change memory material in terms of temperature and time.

FIG. 15 presents a graphical representation of the programming (e.g., setting and resetting) of a volume of phase change memory material. Referring to FIG. 1, programming memory element 15 (addressed by column line 10a and row line 20a) involves, in one example, supplying a voltage to column line 10a to introduce a current into the volume of memory material 30. The current causes a temperature increase at the volume of memory material 30. Referring to FIG. 15, to amorphize a volume of memory material, the volume of memory material is heated to a temperature beyond the amorphisizing temperature, $T_M$ (e.g., beyond the melting point of the memory material). A representative amorphosizing temperature for a $Te_xGe_ySb_z$ material is on the order of about 600° C. to 650° C. Once a temperature beyond $T_M$ is reached, the volume of memory material is quenched or cooled rapidly (by removing the current flow). The quenching is accomplished at a rate, $t_1$, that is faster than the rate at which the volume of memory material 30 can crystallize so that the volume of memory material 30 retains its amorphous state. To crystallize a volume of memory material 30, the temperature is raised by current flow to the crystallization temperature for the material (representatively a temperature between the glass transition temperature of the material and the melting point) and retained at that temperature for a sufficient time to crystallize the material. After such time, the volume of memory material is quenched (by removing the current flow).

In each of these examples of programming (e.g., resetting and setting) a volume of memory material 30, the importance of concentrating the temperature delivery at the volume of memory material 30 is illustrated. One way this is accomplished is modifying a portion of the electrode as described above. The inset of FIG. 15 shows memory cell 15 having an electrode with modified portion 35 (illustrated as a resistor) to concentrate heat (current) at the volume of memory material 30. By increasing the resistance at modified portion 35, a portion of the volume of memory material 30 may be programmed more efficiently, because, in the case of thermally modifiable phase change material, the phase (e.g., amorphous or crystalline) may be set by concentrating the requisite Joule heating at the volume of memory material 30 (i.e., where the resistance of the electrode is greatest). By utilizing a material with a TCR that shows little or no variation in response to a positive temperature change, the electrode resistance at modified portion 35 is retained at high programming temperatures.

Figure 16:
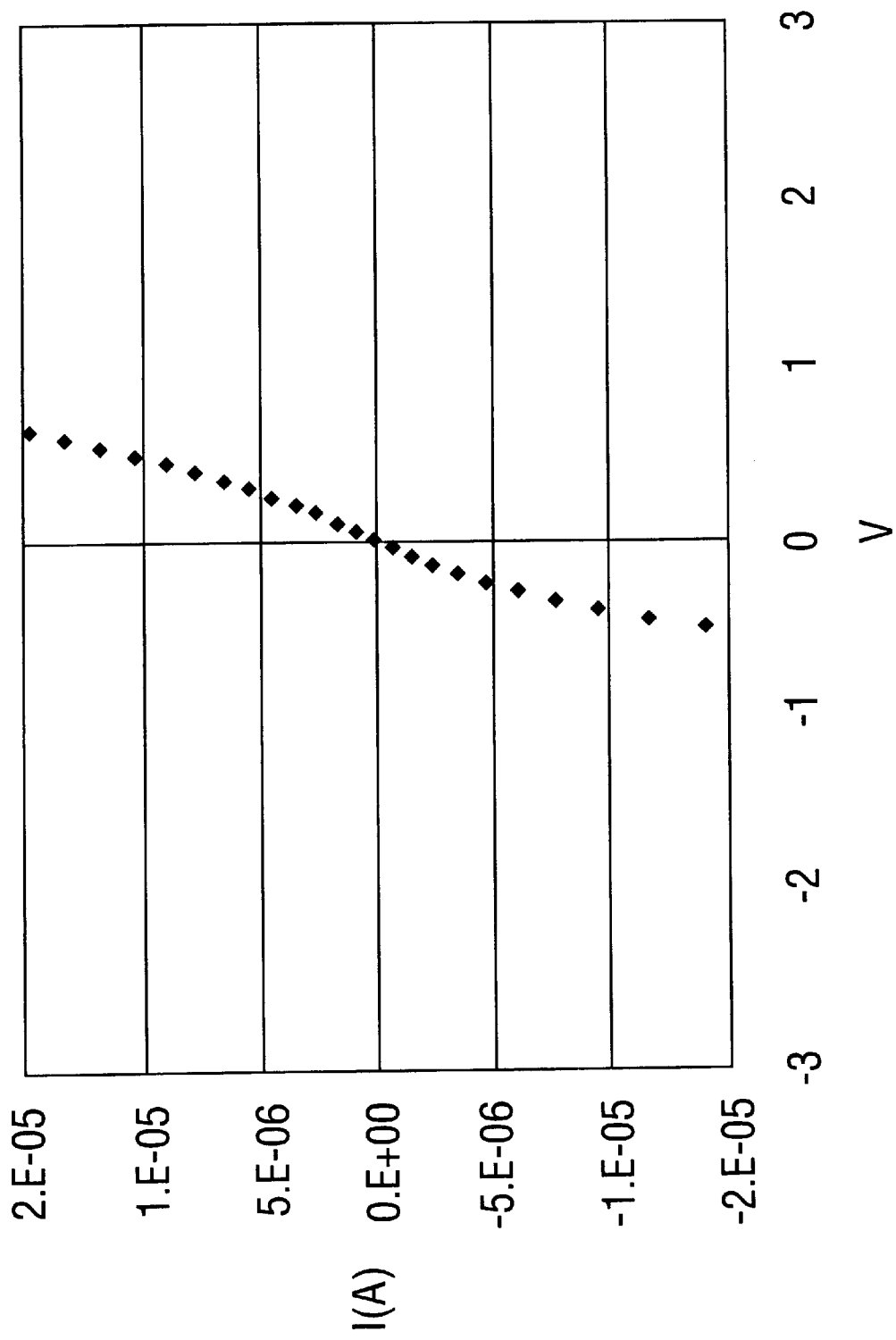
FIG. 16 shows a graphical representation of the current versus voltage for a doped polycrystalline silicon electrode.
Figure 17:
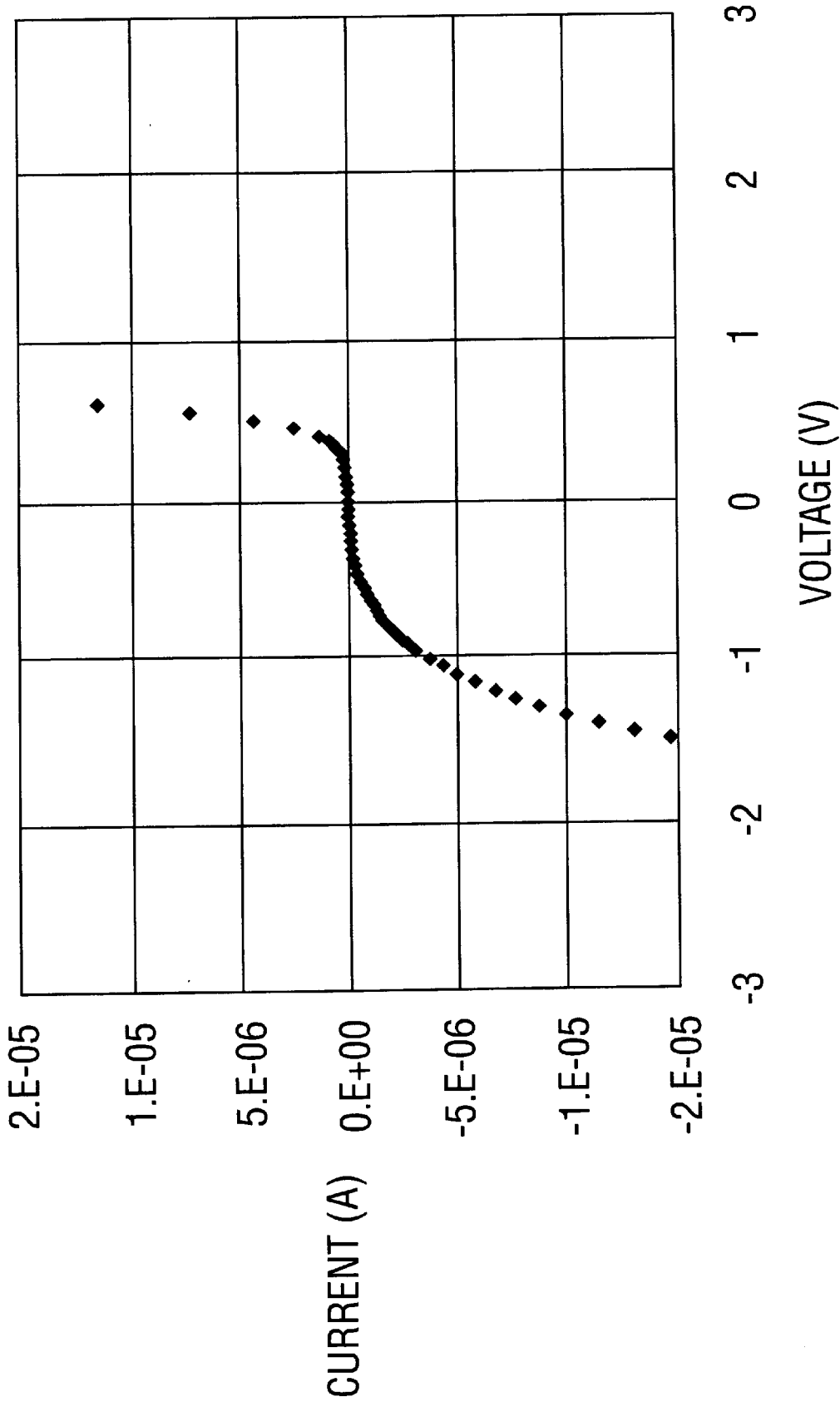
FIG. 17 shows a graphical representation of the current versus voltage for a doped polycrystalline silicon electrode with an introduced modifying species.

FIGS. 16 and 17 compare the resistance attributable to the resistivity of an electrode for a phase change memory element such as memory element 15. FIG. 16 shows the current versus voltage for a doped polycrystalline silicon electrode without an introduced modifying species. FIG. 17 shows the current versus voltage for a polycrystalline silicon electrode with an introduced modifying species, specifically a modifying species of $NH_3$ introduced by way of an RTA as described above to form $Si_3N_4$ in the electrode. FIG. 17 shows significantly more resistance encountered in the modified electrode than the electrode of FIG. 16, as evidenced by the flat portion of the curve between about −0.5 volts and 0.5 volts.

In the preceding example, the volume of memory material 30 was heated to a high temperature to amorphisize the material and reset the memory element (e.g., program 0). Heating the volume of memory material to a lower crystallization temperature crystallizes the material and sets the memory element (e.g., program 1). It is to be appreciated that the association of reset and set with amorphous and crystalline material, respectively, is a convention and that at least an opposite convention may be adopted. It is also to be appreciated from this example that the volume of memory material 30 need not be partially set or reset by varying the current flow and duration through the volume of memory material.

In the foregoing specification, the invention has been described with reference to specific exemplary embodiments thereof. It will, however, be evident that various modifications and changes may be made thereto without departing from the broader spirit and scope of the invention. The specification and drawings are, accordingly, to be regarded in an illustrative rather than a restrictive sense.

What is claimed is:

1. An apparatus comprising:
a volume of memory material;
a conductor; and
an electrode coupled to the volume of memory material and disposed between the volume of memory material and the conductor, the electrode comprising a first portion having a first resistivity value and a second portion having a different second resistivity value formed by exposing the first portion to an ambient.

2. The apparatus of claim 1, wherein the second resistivity value is greater than the first resistivity value.

3. The apparatus of claim 2, wherein the second portion of the electrode is disposed adjacent the volume of memory material.

4. The apparatus of claim 1, wherein the first portion of the electrode has a first thermal coefficient of resistivity and the second portion has a second thermal coefficient of resistivity that has a lower variation to positive temperature change than the first thermal coefficient of resistivity.

5. The apparatus of claim 4, wherein the first portion of the electrode comprises one of polycrystalline silicon and titanium nitride.

6. The apparatus of claim 3, wherein the volume of memory material has two resistivity values, the volume of memory material being settable to one of the resistivity values in response to an electrical input signal, and wherein the distance between the volume of memory material and the conductor defines a depth of the electrode and a depth of the second material is related to a voltage required to set a resistivity value of the volume of the memory material.

7. The apparatus of claim 3, wherein the second material comprises one of silicon dioxide, silicon nitride, silicon oxynitride and titanium oxynitride.

8. An apparatus comprising:
a chalcogenide memory element; and
a heater element in thermal communication with the chalcogenide memory element, the heater element comprising:
a first zone having a first resistivity and a first thermal coefficient of resistivity; and
a second zone formed by exposing a portion of the first zone to an ambient and having a second resistivity and a second thermal coefficient of resistivity, wherein the first resistivity is lower than the second resistivity, and wherein the second thermal coefficient of resistivity has a lower variation to positive temperature change than the first thermal coefficient of resistivity.

9. The apparatus of claim 8, wherein the first zone comprises two segments, and one segment of the first zone is disposed directly adjacent the chalcogenide memory element.

10. The apparatus of claim 8, wherein the chalcogenide memory element has two different states, the chalcogenide memory element being settable to one of the states in response to an electrical input signal, and a dimension of the second zone is related to a voltage required to set a state of the chalcogenide memory element.

11. An apparatus comprising:
a plurality of memory elements, each memory element comprising a volume of memory material having two resistivity values, the volume of memory material being settable to one of the resistivity values in response to a selected electrical input signal;
a conductor coupled to each memory element; and
an electrode coupled to the volume of memory material and disposed between the volume of memory material and the conductor, the electrode comprising a first portion having a first resistivity value and a second portion having a different second resistivity value formed by exposing the electrode to an ambient.

12. The apparatus of claim 11, wherein the second resistivity value is greater than the first resistivity value.

13. The apparatus of claim 12, wherein the second material of the electrode is disposed adjacent the volume of memory material.

14. The apparatus of claim 11, wherein the first portion of the electrode has a first thermal coefficient of resistivity and the second portion has a second thermal coefficient of resistivity that has a lower variation to positive temperature change than the first thermal coefficient of resistivity.

15. The apparatus of claim 12, wherein the first resistivity value corresponds with a resistivity value for a doped polycrystalline silicon.

16. The apparatus of claim 14, wherein the volume of memory material has two resistance values, the volume of memory material being settable to one of the resistance values in response to a selected electrical input signal, and wherein the distance between the volume of memory material and the one contact defines a depth of the electrode and a depth of the second material is related to a voltage required to set a resistance value of the volume of the memory material.

17. The apparatus of claim 14, wherein the second material comprises one of silicon carbide, silicon dioxide, and silicon nitride.

18. A method comprising:
introducing between two conductors formed on a substrate an electrode material;
modifying a portion of the electrode material so that the electrode material comprises a first portion and a different second portion by exposing the electrode material to a gaseous ambient; and
introducing a volume of memory material over the electrode material, the electrode material and the volume of memory material coupled to a conductor.

19. The method of claim 18, wherein modifying a portion of the electrode material comprises exposing the electrode material to a gaseous ambient at elevated temperature to introduce a modifying species that changes the thermal coefficient resistivity of the second portion.

20. The method of claim 19, wherein exposing comprises rapid thermal annealing.

21. The method of claim 19, wherein the distance between the volume of memory material and the one conductor defines a depth of the electrode material and introducing the modifying species comprises introducing the modifying species to a depth related to a voltage required to set a resistance value of the volume of the memory material.

22. The method of claim 21, wherein modifying comprises modifying a portion of the electrode such that the modified portion is directly adjacent the volume of memory material.

* * * * *

UNITED STATES PATENT AND TRADEMARK OFFICE
CERTIFICATE OF CORRECTION

PATENT NO. : 6,404,665 B1
DATED : June 11, 2002
INVENTOR(S) : Lowrey et al.

It is certified that error appears in the above-identified patent and that said Letters Patent is hereby corrected as shown below:

Column 8,
Line 27, delete "$(Te_xGe_ySb_2)$" and insert -- $(Te_xGe_ySb_z)$ --.

Signed and Sealed this

Nineteenth Day of November, 2002

*Attest:*

JAMES E. ROGAN
*Attesting Officer*     *Director of the United States Patent and Trademark Office*